SOLID STATE RELAY UTILIZING VARIABLE PHOTORESISTORS AND ISOLATING DIODES
Filed May 22, 1961
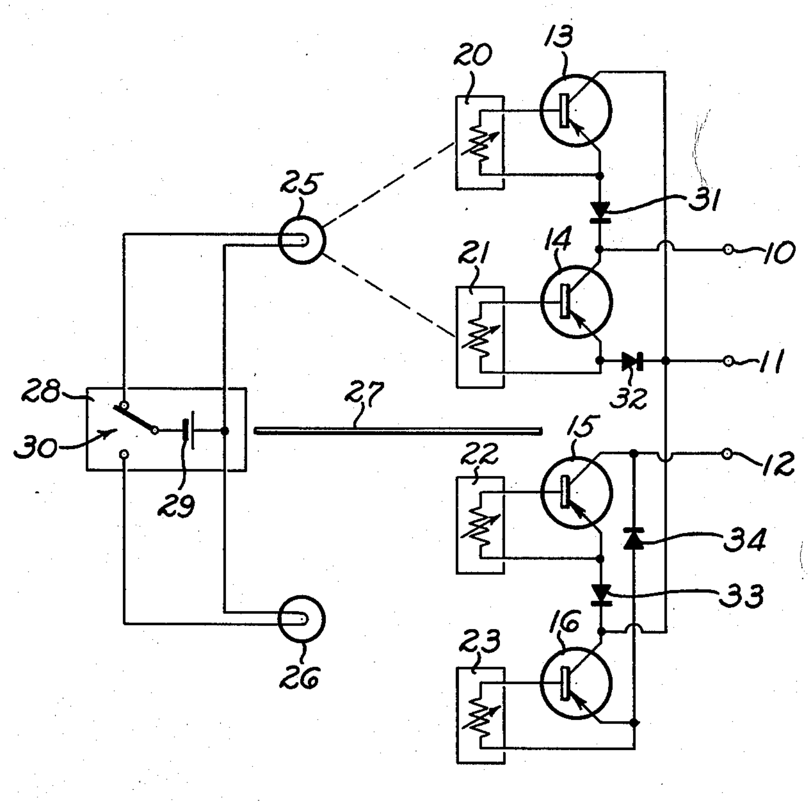
INVENTOR.
CHARLES R. SAUBER
BY HIS ATTORNEYS.
HARRIS, KIECH, RUSSELL & KERN 3,181,003

SOLID STATE RELAY UTILIZING VARIABLE PHOTORESISTORS AND ISOLATING DIODES

Charles R. Sauber, San Diego, Calif., assignor, by direct and mesne assignments, to Celestronics Inc., Beverly Hills, Calif., a corporation of California Filed May 22, 1961, Ser. No. 111,697
8 Claims. (Cl. 307—88.5)

This invention relates to a variable impedance circuit employing solid state devices. The invention is particularly adapted for use in switching circuits and the like as a direct substitute for relays and similar components with moving parts for opening and closing circuits.

Conventional switching circuits of the relay type have a number of disadvantages. The circuit being switched requires moving parts for bringing the contacts into engagement and separating the contacts. The contacts are subject to wear, pitting and chattering which introduces undesired effects into the associated circuitry. Also, care is necessary in the construction of the relay to avoid coupling between the relay operating currents and the circuits being switched. Accordingly, it is an object of the present invention to provide a switching circuit which requires no opening and closing of contacts or other moving parts and which permits complete electrostatic and electromagnetic isolation between the circuits being switched and the control circuitry.

It is an object of the invention to provide a switching circuit including a terminal set having first and second transistor devices connected thereacross in parallel and in opposing polarity, a first photoresistor connected to the first transistor device in current controlling relation, a second photoresistor connected to the second transistor device in current controlling relation, and means for illuminating the two photoresistors for controlling the impedance across the terminal set. A further object is to provide such a switching circuit including two terminal sets to produce a double throw switching operation.

It is a specific object of the invention to provide a switching circuit including a first terminal set having two transistor devices each with a base, an emitter and a collector, first circuit means for connecting the emitter of one transistor device to the collector of the other transistor device, second circuit means for connecting the emitter of the other transistor device to the collector of the one transistor device, and a photoresistor connected across the base and emitter of each transistor device respectively with the first and second circuit means producing the terminals of the first set; a second terminal set including two transistor devices each having a base, emitter and collector, third circuit means for connecting the emitter of one transistor device to the collector of the other transistor device, fourth circuit means for connecting the emitter of the other transistor device to the collector of the one transistor device, and a photoresistor connected across the base and emitter of each transistor device respectively with said third and fourth circuit means providing the terminals of the second set; a first radiation source for illuminating the photoresistors of the first terminal set; a second radiation source for illuminating the photoresistors of the second terminal set; and means for selectively energizing said sources. A further object is to provide various means for selectively controlling the illumination on the photoresistors of the circuit.

It is an object of the invention to provide a circuit having a controlled variable impedance that is bipolar in nature, i.e., the magnitude of the impedance is independent of the polarity of the current or potential applied thereto. A further object is to provide such a circuit incorporating two controlled variable impedances which can be varied simultaneously so as to increase one impedance and reduce the other as desired.

Other objects, advantages, features and results of the invention will more fully appear in the course of the following description. The drawing merely shows and the description merely describes preferred embodiments of the present invention which are given by way of illustration or example.

The single figure of the drawing is a schematic diagram of a preferred embodiment of the invention for use as a single pole double throw relay in a switching circuit. The switching circuit includes terminals 10, 11 and 12, with terminal 11 being the common terminal, terminal 10 the normally closed terminal, and terminal 12 the normally open terminal. The collector of a transistor 13 is connected to the emitter of a transistor 14 and the collector of the transistor 14 is connected to the emitter of the transistor 13 in a series loop to connect the two transistors across the terminals 10, 11 in parallel and in opposite polarity. Transistors 15, 16 are similarly connected to the terminals 11, 12.

A diode 31 may be connected between the emitter of the transistor 13 and the collector of the transistor 14 and another diode 32 between the emitter of the transistor 14 and the collector of the transistor 13 if desired. The diodes enhance the isolation between transistors and improve the open circuit impedance of the circuit. Similar diodes 33, 34 may be used with the transistors 15 and 16.

A photosensitive element, here shown as a photoresistor 20 is connected across the base and emitter of the transistor 13. Similar photoresistors 21, 22, 23 are connected to the transistors 14, 15, 16, respectively.

A lamp 25 is positioned in the device so that the radiation therefrom falls on the photoresistors 20, 21. Another lamp 26 is similarly positioned for illuminating the photoresistors 22, 23. In the embodiment of the drawing, the two lamps 25, 26 will be isolated so that radiation from lamp 25 does not reach photoresistors 22, 23 and similarly that radiation from lamp 26 does not reach photoresistors 20, 21. This is indicated diagrammatically by an opaque barrier 27 positioned between the two lamp-photoresistor sets.

A control circuit 28 is provided for controlling the radiation from the lamps. In the embodiment illustrated, one terminal of each lamp is connected to one terminal of a battery 29. The other terminal of the battery is connected to the moving arm of a switch 30. The fixed contacts of the switch are respectively connected to the other terminal of each of the lamps so that one lamp can be turned on and the other lamp turned off by actuation of the switch 30.

The circuit is shown with the lamp 25 energized and the lamp 26 unenergized placing the terminal set 10–11 in the closed or low impedance condition and the terminal set 11–12 in the open or high impedance condition. The resistance of each photoresistor falls as the amount of light impinging thereon increases. The impedance presented by each transistor to current flow therein decreases as the base-emitter resistance decreases. Hence for high illumination on the photoresistors 20 and 21, the transistors 13, 14 are in the low impedance state. The two transistors are connected in opposing polarity so that the impedance at the terminal set 10–11 will be low and independent of polarity. Since there is no illumination on the photoresistors 22, 23, the base-emitter resistance of the transistors 15, 16 is quite high and the impedance presented at the terminal set 11–12 will be high. The circuit can be switched to the opposite condition by de-energizing the lamp 25 and energizing the lamp 26, as by actuating the switch 30.

The particular transistors and photoresistors selected for use in the switching circuit will depend upon the specific application of the circuit. In general, it is found that the minimum resistance of the photoresistors should be about 10 ohms and it is desirable to have the ratio of resistances for no light and maximum light as high as 50,000 to 1 to achieve maximum impedance change at the terminals 10, 11, 12. Typical components suitable for use in the switching circuit are 2N554 transistors and Ferroxcube model LDR photoresistors, and 1N91 diodes if used. Of course, it is desirable to use matched components in the circuit to provide optimum uniformity of response.

Various means for controlling the illumination on the photoresistors will be obvious to one skilled in this field. A voltage divider or potentiometer or other variable voltage source may be substituted for the switch 30 and battery 29. The two lamps can be controlled independently or as one alternative, the common connection between the lamps could be connected to the moving arm of an auto-transformer or potentiometer to simultaneously increase the power to one lamp and decrease the power to the other. In another variation, both lamps could be continuously energized and the radiation therefrom controlled by vanes positioned between each lamp and its associated photoresistors. In another variation, a single lamp could be used and moved from one side to the other of the barrier 27 for effecting operation of the switching circuit.

It should be noted that a single set of terminals and associated circuitry, e.g., terminals 10, 11, transistors 13, 14 and photoresistors 20, 21 may be used to provide a single throw or off-on switching operation. Also, the switching circuit may be used as a variable impedance of variable resistance circuit by controlling the amount of illumination falling on the photoresistors to a value between the maximum and minimum impedance or off and on conditions. For example, the circuit may be used as a voltage controlled variable impedance circuit by energizing the lamp or lamps from a variable voltage source and adjusting the energizing voltage to produce the desired impedance at the terminals of the circuit.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In a switching circuit, the combination of:

a first terminal set including two transistor devices each having a base, an emitter element and a collector element, two diodes, circuit means for connecting said elements and diodes in a series loop alternating diode and transistor device with the diodes poled opposite to the transistor devices, and a photoresistor connected across the base and emitter element of each transistor device respectively;

a second terminal set including two transistor devices each having a base, an emitter element and a collector element, two diodes, circuit means for connecting said elements and diodes in a series loop alternating diode and transistor device with the diodes poled opposite to the transistor devices, and a photoresistor connected across the base and emitter element of each transistor device respectively;

a first radiation source for illuminating the photoresistors of said first terminal set;

a second radiation source for illuminating the photoresistors of said second terminal set;

and means for selectively energizing said sources.

2. In a switching circuit, the combination of:

a first terminal set including two transistor devices each having a base, an emitter and a collector, two diodes, first circuit means for connecting the emitter of one transistor device to the collector of the other transistor device with an oppositely poled diode therebetween, second circuit means for connecting the emitter of the other transistor device to the collector of the one transistor device with an oppositely poled diode therebetween, and a photoresistor connected across the base and emitter of each transistor device respectively, with said first and second circuit means providing the terminals of the first set;

a second terminal set including two transistor devices each having a base, an emitter and a collector, two diodes, third circuit means for connecting the emitter of one transistor device to the collector, of the other transistor device with an oppositely poled diode therebetween, fourth circuit means for connecting the emitter of the other transistor device to the collector of the one transistor device with an oppositely poled diode therebetween, and a photoresistor connected across the base and emitter of each transistor device respectively, with said third and four circuit means providing the terminals of the second set;

a first radiation source for illuminating the photoresistors of said first terminal set;

a second radiation source for illuminating the photoresistors of said second terminal set;

and means for selectively energizing said sources.

3. In a switching circuit, the combination of:

a first terminal set;

first and second diodes;

first and second transistor devices connected across said first terminal set in parallel and in opposing polarity with an oppositely poled diode in series with each transistor device;

a first photoresistor connected to said first transistor device in current controlling relation;

a second photoresistor connected to said second transistor device in current controlling relation;

a second terminal set;

third and fourth diodes;

third and fourth transistor devices connected across said second terminal set in parallel and in opposing polarity with an oppositely poled diode in series with each transistor device;

a third photoresistor connected to said third transistor device in current controlling relation;

a fourth photoresistor connected to said fourth transistor device in current controlling relation;

and means for illuminating the photoresistors of each of said terminal sets respectviely.

4. In a switching circuit, the combination of:

a pair of terminals;

first and second diodes;

first and second transistor devices connected across said terminals in parallel and in opposing polarity with an oppositely poled diode in series with each transistor device;

a first photoresistor connected to said first transistor device in current controlling relation;

a second photoresistor connected to said second transistor device in current controlling relation;

and means for simultaneously illuminating said first and second photoresistors to control the impedance across said terminals.

5. In a variable impedance circuit, the combination of:

a first terminal set including two transistor devices each having a base, an emitter element and a collector element, two diodes, circuit means for connecting said elements and diodes in a series loop alternating diodes and transistor devices with the diodes poled opposite to the transistor devices, and a photoresistor connected across the base and emitter element of each transistor device respectively;

a second terminal set including two transistor devices each having a base, an emitter element and a collector element, two diodes, circuit means for connecting said elements and diodes in a series loop alternating diodes and transistor devices with the diodes poled opposite to the transistor devices, and a photoresistor connected across the base and emitter element of each transistor device respectively;

variable radiation means for illuminating the photoresistors of said first set and of said second set;

and means for simultaneously increasing the illumination of said first set photoresistors and decreasing the illumination of said second set photoresistors to increase the impedance of one terminal set and decrease the impedance of the other terminal set.

6. In a variable impedance circuit, the combination of:

a first terminal set including two transistor devices each having a base, an emitter element and a collector element, two diodes, circuit means for connecting said elements and diodes in a series loop alternating diodes and transistor devices with the diodes poled opposite to the transistor devices, and a photoresistor connected across the base and emitter element of each transistor device respectively;

a second terminal set including two transistor devices each having a base, an emitter element and a collector element, two diodes, circuit means for connecting said elements and diodes in a series loop alternating diodes and transistor devices with the diodes poled opposite to the transistor devices, and a photoresistor connected across the base and emitter element of each transistor device respectively;

and variable radiation means for illuminating the photoresistors of said first set and of said second set.

7. In a variable impedance circuit, the combination of:

two transistor devices each having a base, an emitter element and a collector element;

two diodes;

circuit means for connecting said elements and diodes in a series loop alternating diodes and transistor devices with the diodes poled opposite to the transistor devices;

a photoresistor connected across the base and emitter element of each transistor device respectively;

a radiation source for illuminating both of said photoresistors;

and means for varying the magnitude of the illumination.

8. In a variable impedance circuit, the combination of:

a pair of terminals;

first and second diodes;

a first transistor device having a base, an emitter element and a collector element;

first circuit means for connecting said elements of said first transistor device between said terminals in series with an oppositely poled first diode;

a second transistor device having a base, an emitter element and a collector element in series with an oppositely poled second diode;

second circuit means for connecting said elements of said second transistor device between said terminals;

a first resistor having a resistance varying as a function of light impinging thereon and connected between the base and emitter element of said first transistor;

a second resistor having a resistance varying as a function of light impinging thereon and connected between the base and emitter element of said second transistor;

a radiation source for illuminating said resistors; and means for varying the magnitude of the illumination to vary the magnitude of the impedance at said terminals.

References Cited by the Examiner

UNITED STATES PATENTS

| | | | |
|---|---|---|---|
| 2,229,125 | 6/41 | Pray | 315—157 |
| 2,482,980 | 9/49 | Kallmann | 307—88.5 |
| 2,836,734 | 5/58 | Cichanowicz | 307—88.5 |
| 2,864,961 | 12/58 | Lohman et al. | 307—88.5 |
| 2,939,361 | 6/60 | Hock | 250—209 |
| 2,972,685 | 2/61 | Baude | 307—88.5 |

ARTHUR GAUSS, *Primary Examiner.*

ROY LAKE, *Examiner.*